United States Patent
Kimura

(10) Patent No.: US 11,973,132 B2
(45) Date of Patent: Apr. 30, 2024

(54) SEMICONDUCTOR DEVICE COMPRISING INSULATED GATE BIPOLAR TRANSISTOR (IGBT), DIODE, AND WELL REGION

(71) Applicant: Mitsubishi Electric Corporation, Tokyo (JP)

(72) Inventor: Kota Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 386 days.

(21) Appl. No.: 17/311,544

(22) PCT Filed: Apr. 1, 2019

(86) PCT No.: PCT/JP2019/014449
§ 371 (c)(1),
(2) Date: Jun. 7, 2021

(87) PCT Pub. No.: WO2020/202430
PCT Pub. Date: Oct. 8, 2020

(65) Prior Publication Data
US 2022/0109062 A1    Apr. 7, 2022

(51) Int. Cl.
*H01L 29/739* (2006.01)
*H01L 29/861* (2006.01)

(52) U.S. Cl.
CPC ........ *H01L 29/7397* (2013.01); *H01L 29/861* (2013.01)

(58) Field of Classification Search
None
See application file for complete search history.

(56) References Cited

U.S. PATENT DOCUMENTS

2013/0087829 A1    4/2013  Tanabe et al.
2016/0247808 A1    8/2016  Horiuchi et al.
(Continued)

FOREIGN PATENT DOCUMENTS

CN    102959705 A    3/2013
CN    202796960 U    3/2013
(Continued)

OTHER PUBLICATIONS

An Office Action; "Notice of Reasons for Refusal," mailed by the Japanese Patent Office dated Aug. 23, 2022, which corresponds to Japanese Patent Application No. 2021-511799 and is related to U.S. Appl. No. 17/311,544; with English language translation.
(Continued)

*Primary Examiner* — Daniel Whalen
(74) *Attorney, Agent, or Firm* — Studebaker & Brackett PC

(57) ABSTRACT

An IGBT (2), a diode (3), and a well region (4) are provided on a semiconductor substrate (1). The IGBT (2) includes a trench gate (6) provided on the first principal surface of the semiconductor substrate (1). The diode (3) includes a p-type anode layer (19) provided on the first principal surface of the semiconductor substrate (1). The well region (4) includes a p-type well layer (21) provided on the first principal surface of the semiconductor substrate (1), having an impurity concentration higher than that of the p-type anode layer (19), and having a depth larger than that of the trench gate (6). A terminal end of the trench gate (6) is surrounded by the p-type well layer (21). The diode (3) is provided on an outer side of the IGBT (2) in the semiconductor substrate (1). The well region (4) is provided on an outer side of the diode (3) in the semiconductor substrate (1).

7 Claims, 7 Drawing Sheets

(56) References Cited

U.S. PATENT DOCUMENTS

| | | | | |
|---|---|---|---|---|
| 2017/0250269 | A1* | 8/2017 | Sumitomo | ............ H01L 29/407 |
| 2017/0263603 | A1* | 9/2017 | Hata | .................... H01L 27/0727 |
| 2018/0076193 | A1 | 3/2018 | Shirakawa et al. | |
| 2018/0308838 | A1 | 10/2018 | Nakamura et al. | |
| 2019/0096878 | A1* | 3/2019 | Arakawa | ............ H01L 27/0727 |
| 2019/0109131 | A1 | 4/2019 | Naito | |

FOREIGN PATENT DOCUMENTS

| | | | |
|---|---|---|---|
| CN | 106688083 | A | 5/2017 |
| CN | 109314141 | A | 2/2019 |
| CN | 109314143 | A | 2/2019 |
| JP | 2012-033897 | A | 2/2012 |
| JP | 2013-026534 | A | 2/2013 |
| JP | 2017-224685 | A | 12/2017 |
| JP | 2018-046187 | A | 3/2018 |
| JP | 2018-186111 | A | 11/2018 |
| WO | 2015/068203 | A1 | 5/2015 |

OTHER PUBLICATIONS

International Search Report; Written Opinion; and Notification of Transmittal of the International Search Report and the Written Opinion of the International Searching Authority, or the Declaration issued in PCT/JP2019/014449; dated Jun. 25, 2019.

An Office Action mailed by the National Intellectual Property Administration of the People's Republic of China on Dec. 13, 2023, which corresponds to Chinese Patent Application No. 201980094734.1 and is related to U.S. Appl. No. 17/311,544 with English language translation.

* cited by examiner

US 11,973,132 B2

SEMICONDUCTOR DEVICE COMPRISING INSULATED GATE BIPOLAR TRANSISTOR (IGBT), DIODE, AND WELL REGION

FIELD

The present invention relates to a semiconductor device provided with an IGBT and a diode on the same semiconductor substrate.

BACKGROUND

A power device that is a semiconductor element for electrical power is widely used in the fields of home appliances, electric vehicles, and railway as well as the fields of generation of solar power and wind power, which are increasingly drawing attention as renewable energy. In many cases, an inverter circuit is established with a power device to drive an inductive load such as an induction motor. In such a case, a freewheeling diode (hereinafter referred to as a diode) for refluxing current generated by back electromotive force of the inductive load is needed, and a typical inverter circuit includes a plurality of insulated gate bipolar transistors (hereinafter referred to as IGBTs) and a plurality of diodes. However, size and weight reduction and cost reduction of an inverter device are strongly desired, and thus it is not preferable to mount a plurality of semiconductor devices. As one solution, a reverse conducting IGBT (hereinafter referred to as an RC-IGBT) with an IGBT and a diode integrated therein has been developed. A device in which a diode is positioned outside of an IGBT to reduce the chip area of an RC-IGBT has been disclosed (refer to Patent Literature 1, for example).

CITATION LIST

Patent Literature

[Patent Literature 1] JP 2018-46187 A

SUMMARY

Technical Problem

However, in a conventional device, a well region in which a terminal end of a trench gate is provided is positioned between an IGBT and a diode. Thus, the diode is located between a well region in which a heavily dosed p$^+$ layer is formed and a terminal region. Accordingly, recovery current increases due to current concentration at diode operation, which potentially damages a semiconductor device.

The present invention is intended to solve the above-described problem and provide a semiconductor device that can prevent recovery breakdown.

Solution to Problem

A semiconductor device according to the present disclosure includes: a semiconductor substrate having a first principal surface and a second principal surface opposite to each other; and an IGBT, a diode, and a well region provided on the semiconductor substrate, wherein the IGBT includes a trench gate provided on the first principal surface of the semiconductor substrate, the diode includes a p-type anode layer provided on the first principal surface of the semiconductor substrate, the well region includes a p-type well layer provided on the first principal surface of the semiconductor substrate, having an impurity concentration higher than that of the p-type anode layer, and having a depth larger than that of the trench gate, a terminal end of the trench gate is surrounded by the p-type well layer, the diode is provided on an outer side of the IGBT in the semiconductor substrate, and the well region is provided on an outer side of the diode in the semiconductor substrate.

Advantageous Effects of Invention

In the present disclosure, the well region is provided on an outer side of the diode in the semiconductor substrate. Thus, the diode is only affected by the p well layer in the well region but not affected by the heavily dosed p$^+$ layer in the terminal region, and thus recovery breakdown can be prevented.

DESCRIPTION OF EMBODIMENTS

A semiconductor device according to the embodiments of the present disclosure will be described with reference to the drawings. The same components will be denoted by the same symbols, and the repeated description thereof may be omitted.

Embodiment 1

Figure 1:
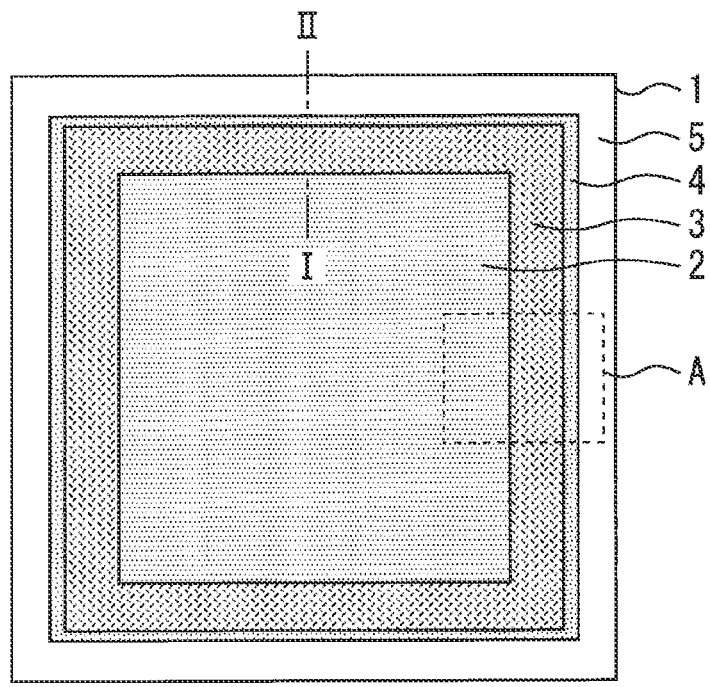
FIG. 1 is a top view illustrating a semiconductor device according to Embodiment 1.

FIG. 1 is a top view illustrating a semiconductor device according to Embodiment 1. This semiconductor device is an RC-IGBT provided with an IGBT 2, a diode 3, a well region 4, and a terminal region 5 on the same semiconductor substrate 1. The IGBT 2 is provided near the center of a chip, and the diode 3 is provided on the outer side of the IGBT 2 in the semiconductor substrate 1. The well region 4 is provided on the outer side of the diode 3 in the semiconductor substrate 1. The terminal region 5 is provided on the outer side of the well region 4.

Figure 2:
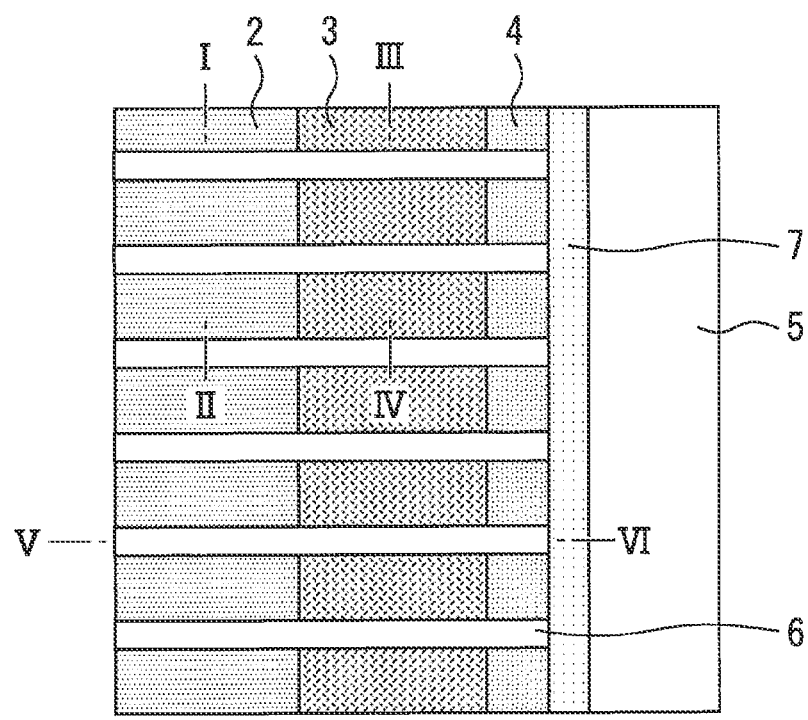
FIG. 2 is an enlarged top view of a region A in FIG. 1.

FIG. 2 is an enlarged top view of a region A in FIG. 1. A plurality of trench gates 6 made of polysilicon are arranged in parallel across the IGBT 2 and the diode 3, and terminal ends of all trench gates 6 are provided in the well region 4. A gate wire 7 made of Al or AlSi is connected with the plurality of trench gates 6 and provided in the well region 4. Note that electrodes and insulating films other than the gate wire 7 on the substrate are omitted in FIG. 2.

Figure 3:
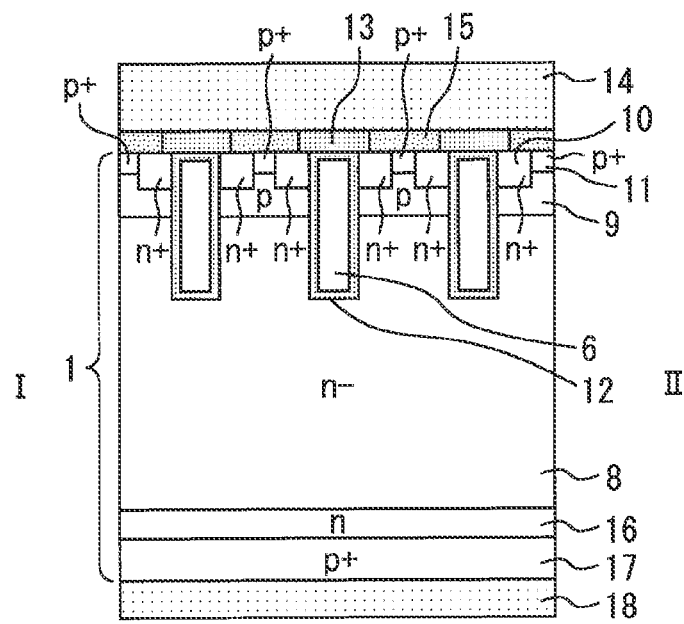
FIG. 3 is a cross-sectional view of the IGBT along I-II in FIG. 2.

FIG. 3 is a cross-sectional view of the IGBT along I-II in FIG. 2. The semiconductor substrate 1 has a first principal surface and a second principal surface opposite to each other. A p-type base layer 9 is provided on the first principal surface side of an $n^-$ drift layer 8 in the semiconductor substrate 1. An $n^+$ emitter layer 10 and a $p^+$ contact layer 11 are provided on a surface of the p-type base layer 9. Each trench gate 6 is provided, through a gate insulating film 12, in a trench penetrating the p-type base layer 9 and an $n^+$ emitter layer 10. An interlayer film 13 made of $SiO_2$ is provided on each trench gate 6. An emitter electrode 14 made of Al or AlSi is connected with the $n^+$ emitter layer 10 and the $p^+$ contact layer 11 through a barrier metal 15 made of Ti. In this manner, a MOSFET structure is provided on the first principal surface in the IGBT 2. A n-type buffer layer 16 and a $p^+$ collector layer 17 are sequentially provided on the second principal surface side of the $n^-$ drift layer 8. A collector electrode 18 made of Al or AlSi is connected with the $p^+$ collector layer 17.

Figure 4:
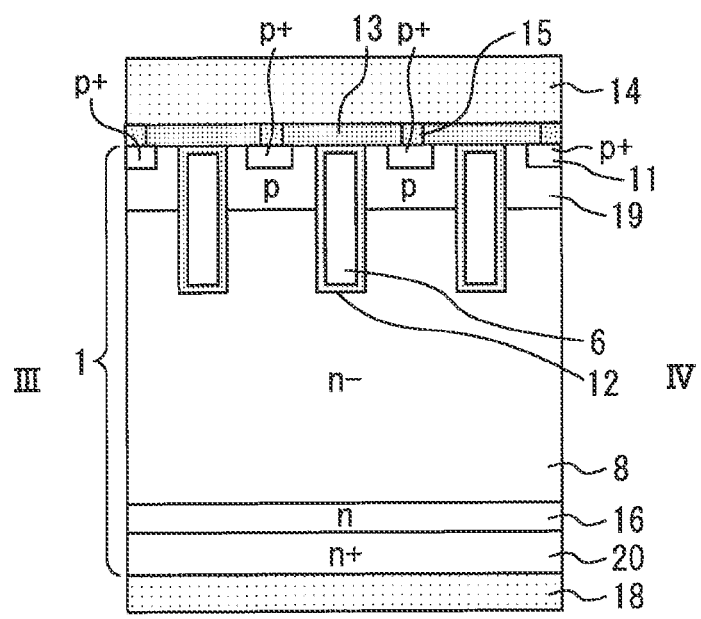
FIG. 4 is a cross-sectional view of the diode along III-IV in FIG. 2.

FIG. 4 is a cross-sectional view of the diode along III-TV in FIG. 2. A p-type anode layer 19 is provided on the first principal surface side of the $n^-$ drift layer 8 in the semiconductor substrate 1. In this manner, an anode structure is provided on the first principal surface in the diode 3. The p-type anode layer 19 is formed simultaneously with the p-type base layer 9 in the IGBT 2 and has an impurity concentration and a depth same as those of the p-type base layer 9. The trench gates 6 are also formed in the diode 3. An $n^+$ cathode layer 20 is provided on the second principal surface in place of the $p^+$ contact layer 11 in the IGBT 2.

Figure 5:
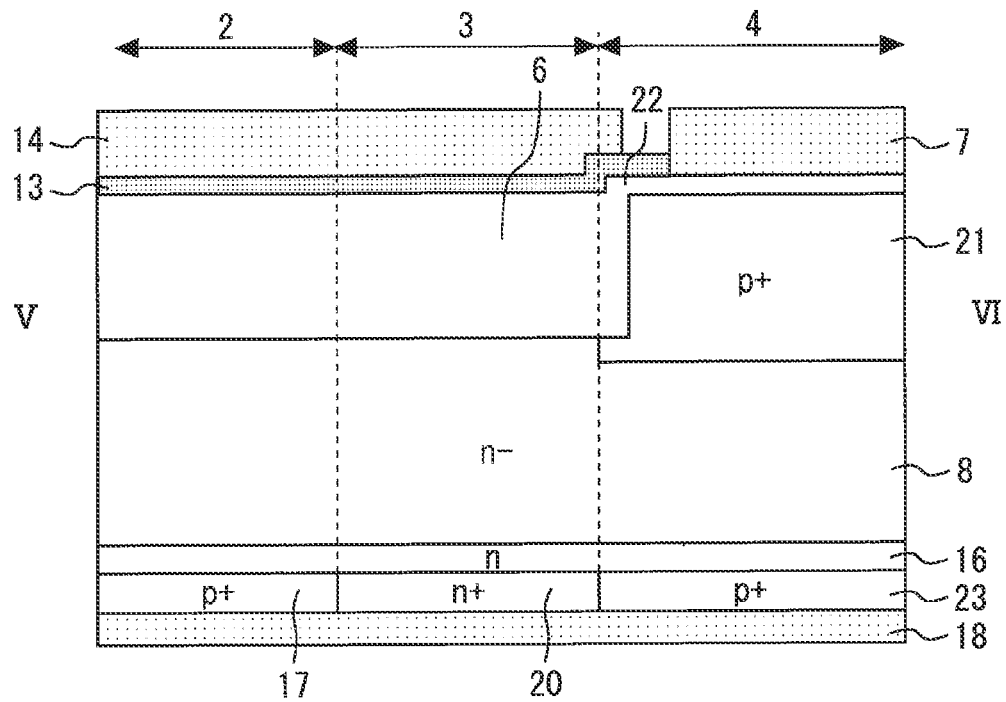
FIG. 5 is a cross-sectional view along V-VI in FIG. 2.

FIG. 5 is a cross-sectional view along V-VI in FIG. 2. In the well region 4, a $p^+$ well layer 21 is provided on the first principal surface of the semiconductor substrate 1. The $p^+$ well layer 21 has an impurity concentration higher than that of the p-type anode layer 19 and has a depth larger than that of each trench gate 6. The terminal end of each trench gate 6 is surrounded by the $p^+$ well layer 21. Each trench gate 6 has a raised part 22 connected with the gate wire 7 in the well region 4. A $p^+$ layer 23 is provided on the second principal surface of the semiconductor substrate 1 in the well region 4. The $p^+$ layer 23 has an impurity concentration equivalent or close to that of the $p^+$ collector layer 17 in the IGBT 2. Note that, the boundary between the $p^+$ collector layer 17 and the $n^+$ cathode layer 20 on the second principal surface is same as the boundary between the IGBT 2 and the diode 3, but the present disclosure is not limited thereto and the boundaries do not necessarily need to coincide.

Figure 6:
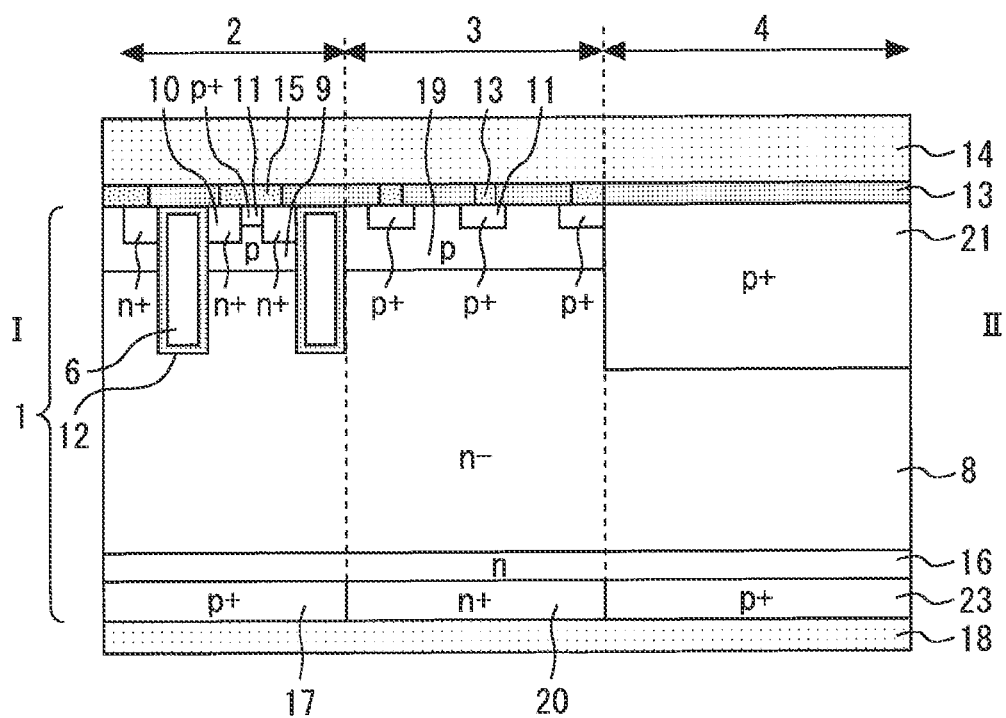
FIG. 6 is a cross-sectional view along I-II in FIG. 1.

FIG. 6 is a cross-sectional view along I-II in FIG. 1. The diode 3 and the well region 4 are provided in parallel to the trench gates 6 on the upper and lower sides of the IGBT 2 in FIG. 1. Thus, the trench gates 6 are not provided in the diode 3 and the well region 4, and the gate wire 7 is not provided in the well region 4.

Note that although the diode 3 surrounds the four sides of the IGBT 2 in the present embodiment, the present disclosure is not limited thereto, and the diode 3 only needs to contact the well region 4 on the outer side of the IGBT 2. For example, the diode 3 may be provided only on one side, two sides, or three sides of the IGBT 2 or may not necessarily be provided continuously but at intervals. In addition, an n-type carrier storage region may be provided directly below the p-type base layer 9 in the IGBT 2 and the p-type anode layer 19 in the diode 3.

Figure 7:
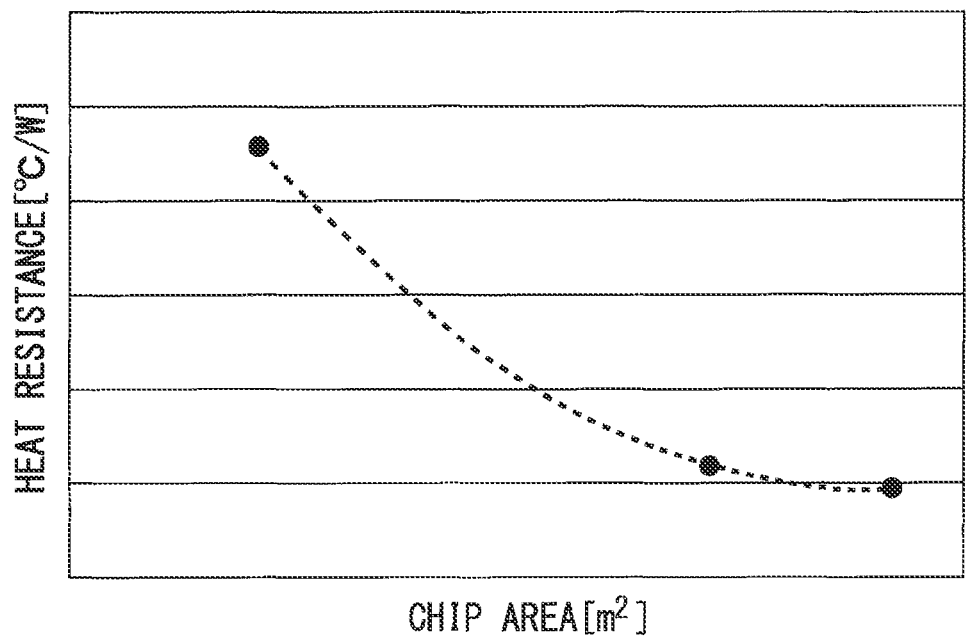
FIG. 7 is a diagram illustrating the relation between the chip area and the heat resistance.

When an IGBT and a diode are separate elements, heat resistance of each element is determined by chip area and thickness only. FIG. 7 is a diagram illustrating the relation between the chip area and the heat resistance. The chip area needs to be increased for improvement of the heat resistance, which poses an obstacle in size and weight reduction and cost reduction of an inverter device. However, the semiconductor device according to the present embodiment is an RC-IGBT in which the IGBT 2 and the diode 3 are formed on the same semiconductor substrate 1. Thus, the diode 3 contributes to heat-releasing while the IGBT 2 is operating, and the IGBT 2 contributes to heat-releasing while the diode is operating. Accordingly, the heat resistance can be improved as compared to a case in which the IGBT 2 and the diode 3 are separate elements.

Figure 8:
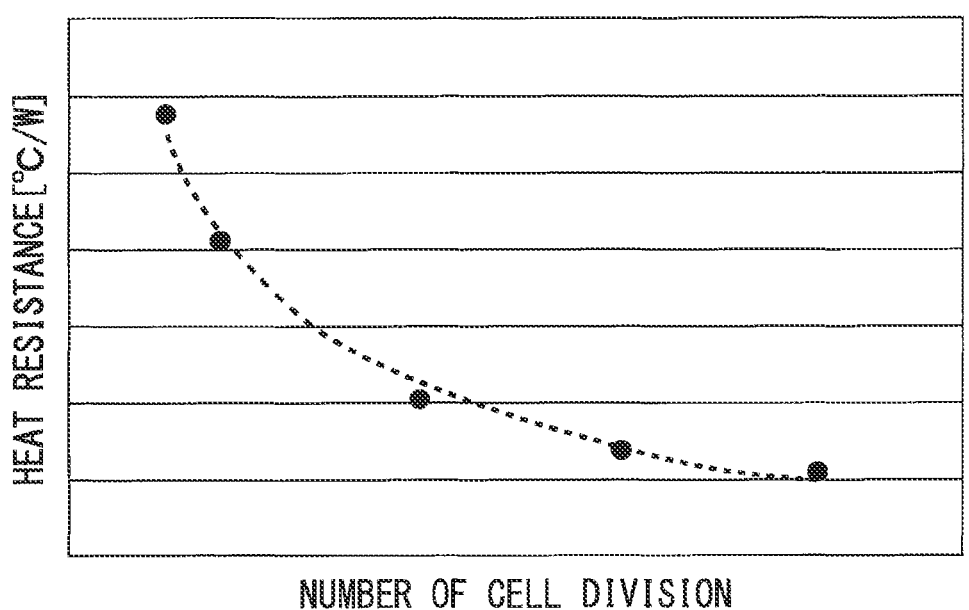
FIG. 8 is a diagram illustrating the correlation between the number of cell divisions and the heat resistance.

The heat resistance can be controlled through arrangement of the IGBT 2 and the diode 3. FIG. 8 is a diagram illustrating the correlation between the number of cell divisions and the heat resistance. In a case of a stripe structure in which the IGBT 2 and the diode 3 are alternately arranged as in the present embodiment, the heat resistance can be improved by increasing the number of divisions.

Figure 9:
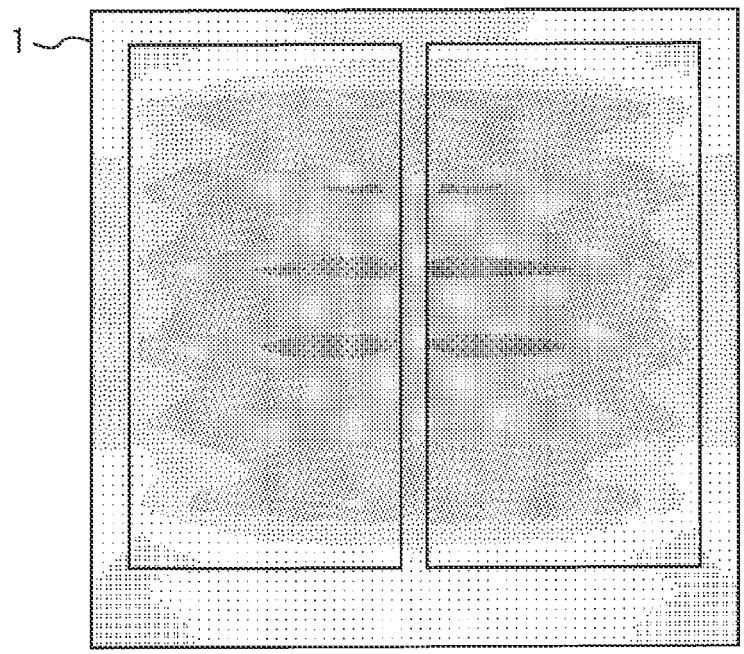
FIG. 9 is a diagram illustrating temperature distribution of the RC-IGBT, which is obtained by thermal analysis simulation.
Figure 10:
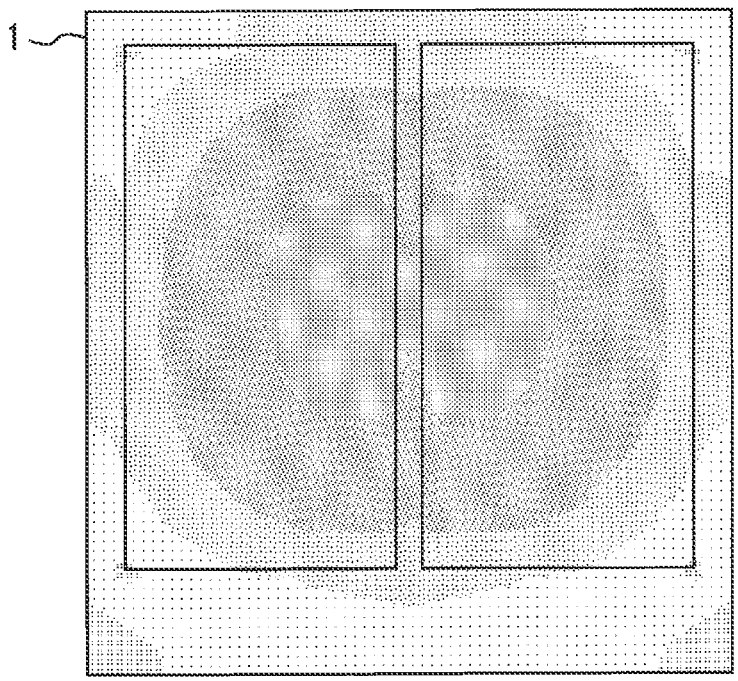
FIG. 10 is a diagram illustrating temperature distribution of the IGBT as a single body, which is obtained by thermal analysis simulation.

FIG. 9 is a diagram illustrating temperature distribution of the RC-IGBT, which is obtained by thermal analysis simulation. FIG. 10 is a diagram illustrating temperature distribution of the IGBT as a single body, which is obtained by thermal analysis simulation. More significant heat dispersion of the RC-IGBT is observed than that of the IGBT as a single body. However, similarly to the IGBT or the diode as a single body, the RC-IGBT has highest temperature at the center of the chip due to heat interference between adjacent regions. A module structure is determined by a highest possible temperature $T_{jmax}$ at energization in many cases, and thus heat concentration at the center of the chip is not preferable in chip designing.

When arrangement is designed to decrease a loss of the entire RC-IGBT, the effective area of the IGBT 2 is larger than the effective area of the diode 3 in many cases. As the effective area of the diode 3 decreases, heat becomes less likely to spread in the chip, and the heat resistance of the diode 3 degrades beyond assumption. Thus, the diode 3, which has a high thermal load, is provided outside of the IGBT 2 to have separation from a central part of the chip where temperature becomes high.

When the trench gates 6 are not formed in the diode 3 and the terminal ends of the trench gates 6 are provided at the boundary between the IGBT 2 and the diode 3 or in the IGBT 2, gate capacitance is small, which is advantageous as a switching characteristic. However, withstand voltage significantly decreases when the terminals end of the trench gates 6 are provided in the p-type anode layer 19 in the diode 3 or the p-type base layer 9 in the IGBT 2, which has a low impurity concentration. Thus, in the present embodiment, the trench gates 6 are provided across the IGBT 2 and the diode 3, and the terminals end of the trench gates 6 are provided in the well region 4. The $p^+$ well layer 21, which has an impurity concentration higher than that of the p-type anode layer 19 in the diode 3, is provided deeper than the trench gates 6 in the well region 4 and surrounds the terminal ends of the trench gates 6, thereby preventing withstand voltage decrease. This structure is provided only on a side, among the four sides of the chip, where a boundary surface between the IGBT 2 and the diode 3 is orthogonal to the direction of the trench gates 6. The trench gates 6 may not be provided in the diode 3 and the well region 4 on a side where the boundary surface and the direction of the trench gates 6 are parallel to each other.

In a conventional configuration, a diode is located between a well region in which a heavily dosed p+ layer is formed and a terminal region, which leads to a problem in that recovery breakdown occurs due to current concentration at diode operation. However, in the present embodiment, the well region 4 is provided on the outer side of the diode 3 in the semiconductor substrate 1. Thus, the diode 3 is only affected by the p+ well layer 21 in the well region 4 but not affected by the terminal region, and thus recovery breakdown can be prevented.

The diode 3 is in contact with the well region 4, which does not generate heat at energization. This increases area that contributes to heat-releasing of the diode 3, and accordingly, the heat resistance of the diode 3, which has a small area and a high thermal load, can be decreased. Thus, heat that would otherwise concentrate at the center of the chip at energization can be dispersed to the outer side.

When the p+ well layer 21 in the well region 4 operates as a diode, the recovery current increase, which leads to loss degradation and recovery breakdown. Thus, the p+ layer 23 is provided on the second principal surface of the semiconductor substrate 1 in the well region 4. Accordingly, diode operation of the well region 4 can be prevented.

Embodiment 2

Figure 11:
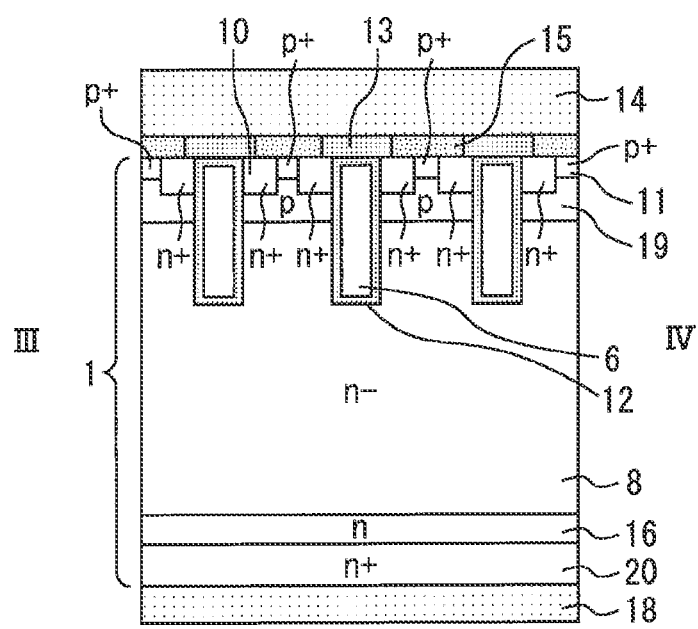
FIG. 11 is a cross-sectional view illustrating the diode of a semiconductor device according to Embodiment 2.

FIG. 11 is a cross-sectional view illustrating the diode of a semiconductor device according to Embodiment 2. The n+ emitter layer 10 is provided beside each trench gate 6 in the diode 3. Note that the n+ emitter layer 10 may be also provided beside each trench gate 6 in the well region 4.

An n inversion layer can be formed in the p-type anode layer 19 by applying voltage to the trench gates 6 at recovery operation of the diode 3. Accordingly, holes injected from the p-type anode layer 19 are reduced and the recovery current is reduced. The present embodiment is particularly effective for the p+ well layer 21 because the p+ well layer 21 has an impurity concentration higher that of the p-type anode layer 19 and thus the recovery current is larger. The other configuration and effects are same as those of Embodiment 1.

Embodiment 3

Figure 12:
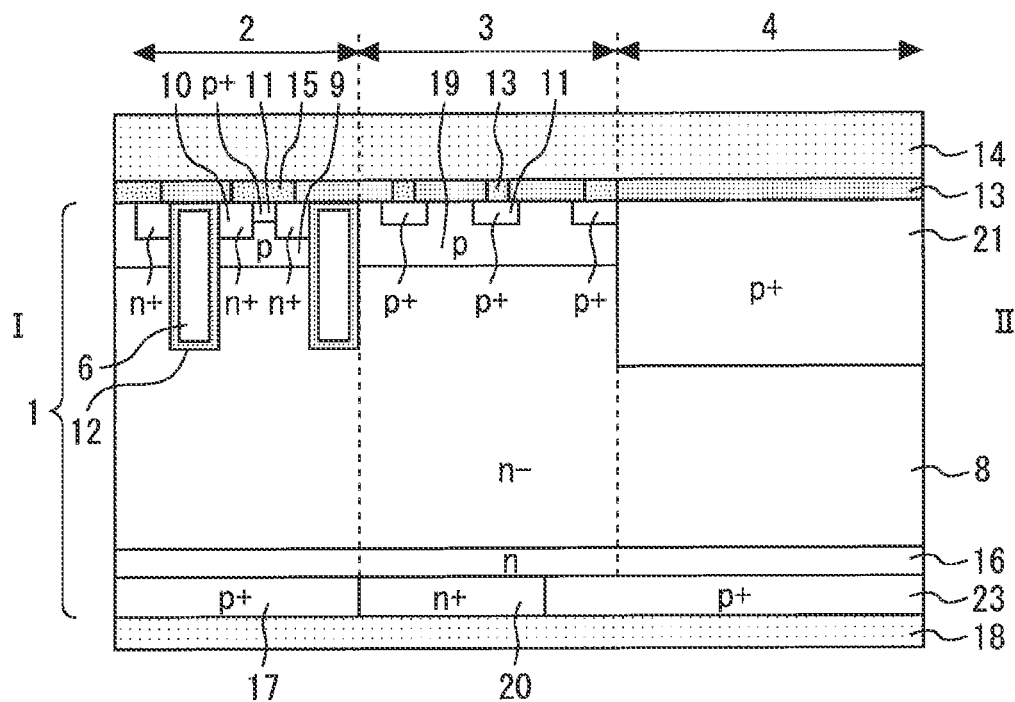
FIG. 12 is a cross-sectional view illustrating a semiconductor device according to Embodiment 3.

FIG. 12 is a cross-sectional view illustrating a semiconductor device according to Embodiment 3. The position of the section is same as that of FIG. 6 in Embodiment 1. The boundary between the n+ cathode layer 20 and the p+ layer 23 on the second principal surface side in the semiconductor substrate 1 is positioned closer to the center of the semiconductor substrate 1 than the boundary between the p-type anode layer 19 and the p+ well layer 21 on the first principal surface side.

In Embodiment 1, in the well region 4, the p+ layer 23 is provided on the second principal surface side in the semiconductor substrate 1, thereby preventing diode operation of the well region 4. However, at a boundary part between the diode 3 and the well region 4, the recovery current is large and the loss degrades due to influence of the heavily dosed p+ layer 23 in the well region 4 on the first principal surface side. However, in the present embodiment, the boundary between the n+ cathode layer 20 and the p+ layer 23 on the second principal surface side is shifted closer to the center of the semiconductor substrate 1, and accordingly, electrons from the second principal surface side in the diode 3 do not flow into the well region 4, and the recovery current is reduced. The other configuration and effects are same as those of Embodiment 1.

Embodiment 4

Figure 13:
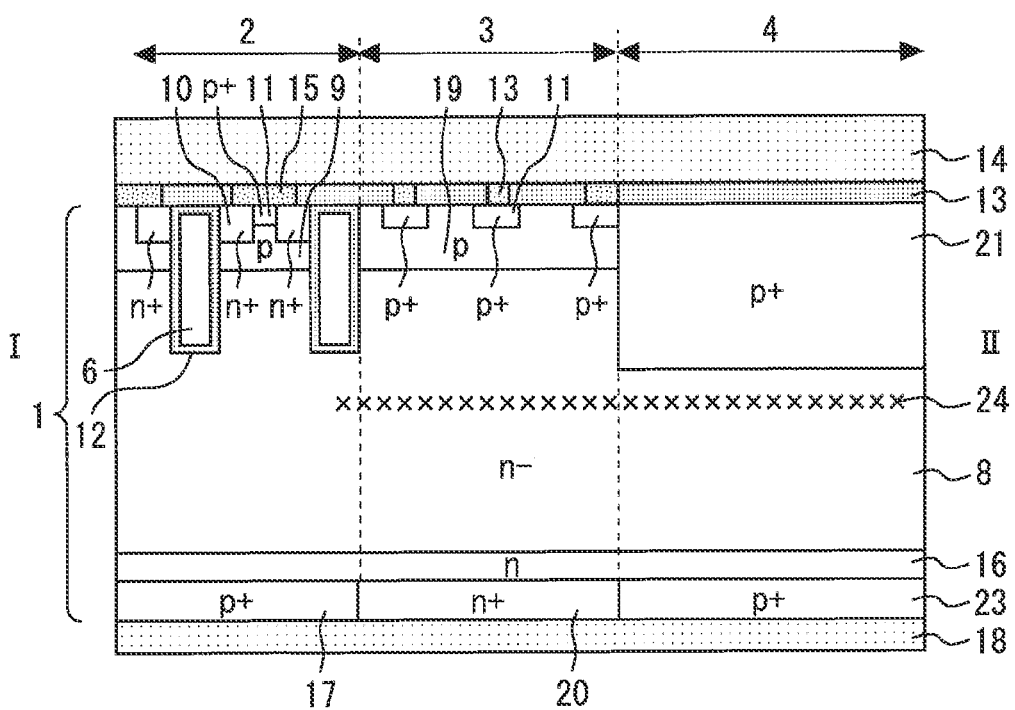
FIG. 13 is a cross-sectional view illustrating a semiconductor device according to Embodiment 4.

FIG. 13 is a cross-sectional view illustrating a semiconductor device according to Embodiment 4. The position of the section is same as that of FIG. 6 in Embodiment 1. A lifetime control layer 24 in which a crystal defect is locally provided through particle irradiation of helium, proton, or the like is provided below the p-type anode layer 19 in the diode 3 and the p+ well layer 21 in the well region 4.

As described above in Embodiment 1, the recovery current is large and the loss degrades at the boundary part between the diode 3 and the well region 4 due to influence of the heavily dosed p+ well layer 21 in the well region 4 on the first principal surface side. However, in the present embodiment, the lifetime control layer 24 having a short carrier lifetime is formed below the p-type anode layer 19 in the diode 3 and the p+ well layer 21 in the well region 4, thereby reducing the recovery current. The other configuration and effects are same as those of Embodiment 1. Note that the configurations of Embodiments 2 to 4 may be combined with each other.

Note that the semiconductor substrate 1 is not limited to a semiconductor substrate formed of silicon but may be formed of a wide bandgap semiconductor having a bandgap larger than that of silicon. The wide bandgap semiconductor is, for example, silicon carbide, nitridation gallium material, or diamond. A semiconductor device formed of such a wide bandgap semiconductor has high withstand voltage and high allowable current density and thus can be downsized. When the downsized semiconductor device is used, a semiconductor module in which the semiconductor device is incorporated can be downsized as well. In addition, since the semiconductor device has high thermal resistance, a heat-releasing fin of a heat sink can be downsized and a water cooling unit can be replaced with an air cooling unit, and accordingly, the semiconductor module can be further downsized. Moreover, the semiconductor device has a low electrical power loss and high efficiency, which leads to high efficiency of the semiconductor module.

REFERENCE SIGNS LIST 1 semiconductor substrate; 2 IGBT; 3 diode; 4 well region; 6 trench gate; 10 n+ emitter layer; 19 p-type anode layer; 20 n+ cathode layer; 21 p well layer; 23 p+ layer; 24 lifetime control layer

The invention claimed is:
1. A semiconductor device comprising:
a semiconductor substrate having a first principal surface and a second principal surface opposite to each other; and
an insulated gate bipolar transistor (IGBT), a diode, and a well region provided in the semiconductor substrate,
wherein the IGBT includes a trench gate provided in the first principal surface of the semiconductor substrate,
the diode includes a p-type anode layer provided in the first principal surface of the semiconductor substrate,
the well region includes a p-type well layer provided in the first principal surface of the semiconductor substrate, having an impurity concentration higher than that of the p-type anode layer, and having a depth larger than that of the trench gate, a terminal end of the trench gate extends into the p-type well layer such that the p-type well layer surrounds the terminal end in a plan view, the diode is provided on an outer side of the IGBT in the semiconductor substrate, and the well region is provided on an outer side of the diode in the semiconductor substrate.

2. The semiconductor device according to claim 1, wherein the diode is in contact with the well region.

3. The semiconductor device according to claim 1, wherein the well region includes a p-type layer provided in the second principal surface of the semiconductor substrate.

4. The semiconductor device according to claim 3, wherein the diode includes an n-type cathode layer provided in the second principal surface of the semiconductor substrate, and a boundary between the n-type cathode layer and the p-type layer on the second principal surface side is positioned closer to a center of the semiconductor substrate than a boundary between the p-type anode layer and the p-type well layer on the first principal surface side.

5. The semiconductor device according to claim 1, wherein an n-type emitter layer is provided beside the trench gate in the diode.

6. The semiconductor device according to claim 1, wherein a lifetime control layer is formed below the p-type anode layer in the diode and the p-type well layer in the well region.

7. The semiconductor device according to claim 1, wherein the semiconductor substrate is formed of a wide bandgap semiconductor.

* * * * *